United States Patent [19]

Matsumoto et al.

[11] Patent Number: 4,762,771

[45] Date of Patent: Aug. 9, 1988

[54] METHOD OF TREATING PHOTOSENSITIVE PRINTING PLATE

[75] Inventors: Hiroshi Matsumoto; Hitoshi Hagiwara, both of Kanagawa, Japan

[73] Assignee: Fuji Photo Film Co., Ltd., Kanagawa, Japan

[21] Appl. No.: 890,737

[22] Filed: Jul. 30, 1986

[30] Foreign Application Priority Data

Aug. 1, 1985 [JP] Japan ................. 60-170465

[51] Int. Cl.$^4$ .............................................. G03C 7/02
[52] U.S. Cl. ..................................... 430/302; 430/309
[58] Field of Search ...................... 430/302, 309, 159

[56] References Cited

U.S. PATENT DOCUMENTS

| | | | |
|---|---|---|---|
| 3,307,951 | 3/1967 | Adams et al. | 430/302 |
| 4,230,492 | 10/1980 | Thomas | 430/302 |
| 4,294,910 | 10/1981 | Wielinga . | |
| 4,329,422 | 5/1982 | Langlais | 430/309 |
| 4,355,096 | 10/1982 | Walls | 430/302 |

FOREIGN PATENT DOCUMENTS 1555233 11/1979 United Kingdom .

Primary Examiner—Roland E. Martin
Assistant Examiner—Patrick A. Doody
Attorney, Agent, or Firm—Burns, Doane Swecker & Mathis

[57] ABSTRACT

The present invention provides a method of treating photosensitive printing plate, which comprises subjecting a photosensitive lithographic plate to exposure, development and burning-in treatment, characterized in that an aqueous solution containing phytic acid and aminobenzenesulfonic acid is applied to the lithographic plate after the development but prior to the burning-in treatment and then the burning-in treatment is conducted in the presence of these compounds.

According to the invention, there can be prepared a lithographic plate free from background stain and having an excellent ink-receptive property in its image-forming area.

13 Claims, No Drawings

METHOD OF TREATING PHOTOSENSITIVE PRINTING PLATE

BACKGROUND OF THE INVENTION (1) Field of the Invention

The present invention relates to a method of treating a photosensitive printing plate. More particularly, the invention relates to a method wherein a photosensitive lithographic plate comprising a metal base is subjected to imagewise exposure, development and then burning-in treatment.

(2) Prior Art

Lithography is a printing method that takes full advantage of the fact that water and an oil are essentially immiscible with each other. The surface of a lithographic plate has a water-accepting, oily ink-repelling region and a water-repellent, oily ink-accepting region; the former being a non-image-forming region and the latter being an image-forming region. Therefore, a photosensitive composition used for making the lithographic plate must repel water and accept an oily ink after the image formation.

The photosensitive compositions used in the preparation of lithographic plates are classified into negative working and positive working ones. As positive working photosensitive compositions, those comprising an o-quinone diazide compound have been used widely.

The positive working photosensitive lithographic plates are prepared by applying an o-quinone diazide compound alone or a mixture thereof with an alkali-soluble resin such as a novolac phenolic resin or cresol resin to a metal or plastic base. When the photosensitive lithographic plate is exposed to actinic light though a positive transparency, the o-quinone diazide compound in the exposed region is decomposed to form an alkali-soluble compound, which is removed easily with an aqueous alkali solution to form a positive image. Thus, when a base having a hydrophilic surface is used, the hydrophilic surface is exposed in the region in which the o-quinone diazide compound has been removed with the aqueous alkali solution. Therefore, water is accepted and an ink is repelled in this region. On the other hand, the remaining, image-forming region is oleophilic and accepts the ink.

The negative working photosensitive compositions usually comprise a diazonium salt, azide compound or photopolymerizable compound. These compositions are applied to a base either alone or in the form of a mixture with an additive such as a suitable resin. When the base used has a hydrophilic surface, unexposed photosensitive composition is removed with a developer to expose the hydrophilic surface of the base. This hydrophilic surface accepts water and repels the ink. On the other hand, a photosensitive composition hardened by the exposure and left as an image in the development step is oleophilic and, therefore, accepts the ink.

The lithographic plate thus prepared is placed in an offset printing machine to obtain clear prints. By properly selecting the base and the photosensitive layer composition to be coated on the base of the lithographic plate thus preparing the photosensitive plate, tens of thousands of beautiful prints can be obtained. Particularly when an aluminum plate, which has been grained and treated by anodic oxidation, is used a hundred thousand clear prints can be obtained.

However, in some cases it is desirable to obtain much more prints from a single printing plate. In such a case, a photosensitive lithographic plate comprising a metal base plate such as an aluminum or zinc plate is exposed and developed by an ordinary method and then heated to a high temperature to effect a so-called burning-in treatment and thereby strengthening the image-forming part.

By effecting the burning-in treatment, the number of prints obtainable from a single lithographic plate can be increased to several times that obtainable when the burning-in treatment is not employed.

Further a special printing ink can be used which contains a large amount of a component in which the image-forming components on the printing plate are soluble such as an U.V. curing ink or low temperature drying ink. With this ink, a sufficient number of printed sheets can be obtained by using the lithographic plate subjected to the burning-in treatment, since the resistance of the image-forming part to the solvent is improved remarkably. However the number of the printed sheets obtained by the aforementioned arrangement is reduced drastically as compared with the number of printed sheets obtained by using ordinary ink with a plate prepared by an ordinary method including no burning-in treatment, due to the dissolution of the image-forming part.

However, by the burning-in treatment, the hydrophilic property of the non-image-forming part of the printing plate (i.e. a part in which the hydrophilic base surface has been exposed by the development) deteriorates while accepting, the printing ink to stain the background of the print. But, when the degree of heating is reduced, so as not to cause background stain, the burning effect is not obtained and the image-forming part is not reinforced. Thus, a counter-etching treatment is indispensable for preventing the non-image-forming part from staining from the burning-in treatment. Various processes for counter-etching, both prior to and/or after the burning treatment, have been proposed.

For example, an aqueous solution of a fluoride such as hydrofluoric acid, borofluoric acid or hydrosilicofluoric acid has been used as an agent for removing stains in the non-image-forming part and recovering the hydrophilic property after the burning treatment. However, these fluorides are poisonous substances and they pose environmental pollution problems.

Further, when the above described counter-etching treatment is effected, the metallic surface of the base is corroded, consequentially it easily scratches and abrasion resistance is reduced. As a result, the water retention ability of the non-image-forming part is lost over the course of the printing, background stain is caused, and it becomes intolerable to printing.

A process for preventing the reduction of the hydrophilic property in the non-image-forming region, prior to the burning-in treatment, is disclosed in U.S. Pat. No. 4,294,910 which comprises treating the plate with an aqueous solution of an organic sulfonic acid salt, such as a sodium alkylnaphthalenesulfonate or sodium alkyl diphenyl ether sulfonate or lithium nitrate, prior to the burning. Among them, the aqueous solution of the organic sulfonic acid salt, such as the sodium alkylnaphthalenesulfonate or sodium alkyl diphenyl ether sulfonate, are unsuitable for use in the spray circulation type treating machine now generally used, since it has an extremely high foaming property. When said solution is used, the process cannot be automated. Further, when the plate is treated with a lithium nitrate solution and then subjected to burning-in treatment, sufficient prevention of background stains is impossible. U.S. Pat. No. 4,063,507 discloses a process wherein the plate is treated with an aqueous solution of subliming boric acid and its salt prior to the burning-in treatment and the plate is subjected to the burning treatment in the presence of said compounds. However, there is insufficient prevention of background stains by this process. With this process background occurs easily depending on the conditions of washing with water, and gumming is effected after the burning-in treatment. This is particularly true when the water wash is insufficient or a desensitizing gum comprising a dextrin having a low hydrophilyzing power is used as a lithographic finisher. A process, wherein the plate is treated with an aqueous solution of an organic substance, such as gum arabic, cellulose ether or polyacrylic acid and/or an aqueous solution of a water-soluble inorganic salt such as a boric acid salt, phosphoric acid salt or sulfuric acid salt or an alkali metal or alkaline earth metal halide, prior to the burning-in treatment, is disclosed in Canadian Pat. No. 1084758. However, this process also has defects in that background stains are not always completely prevented. When gum arabic, or an aqueous solution of a water-soluble polymer such as polyacrylic acid is used, the image-forming region barely accepts ink (so-called image-blinding). Further, a process wherein the plate is treated with an aqueous solution of an amine having a carboxyl group, such as ethylenediaminetetraacetic acid or hydroxyalkylethylene-diaminetriacetic acid or a salt thereof, prior to the burning-in treatment is disclosed in U.S. Pat. No. 4,355,096. Likewise, in this process, the effect of preventing background stain is still insufficient.

SUMMARY OF THE INVENTION

The present invention has been completed on the basis of discovery that the above-mentioned problems can be solved by subjecting the lithographic plate to a burning-in treatment in the presence of phytic acid or its water-soluble salt, and aminobenzenesulfonic acid or its water-soluble salt, after the development.

It is therefore a primary object of the present invention to provide an improved method for treating a photosensitive printing plate including a burning-in treatment. More particularly, the object of the invention is to provide a method of treating a photosensitive printing plate including a burning-in treatment capable of forming a lithographic plate free from background-stains and having an excellent ink-receptive property in its image-forming area.

Another object of the present invention is to provide a method of treating a photosensitive printing plate including a burning-in treatment which can be automated with a spray circulation system processing machine.

These and other objects of the present invention will be clear from the following description.

In accordance with the present invention, there is provided a method which comprises subjecting a photosensitive lithographic plate to imagewise exposure to light, development and burning-in treatment, in which an aqueous solution containing phytic acid and/or its water-soluble salt and aminobenzenesulfonic acid and/or its water-soluble salt is applied to the lithographic plate after the development but prior to the burning-in treatment and then the burning-in treatment is conducted in the presence of these compounds.

DESCRIPTION OF THE PREFERRED EMBODIMENTS

The aqueous solution to be applied to the lithographic plate (hereinafter referred to as "treating solution used prior to the burning-in treatment") after the development must contain free phytic acid and/or its water-soluble salt as an active component(s). The water-soluble salts include, for example, alkali metal saklts such as sodium, potassium and lithium salts, ammonium salts nd amine salts. Examples of the amine salts include diethylamine, triethylamine, propylamine, dipropylamine, tripropylamine, butylamine, amylamine, hexylamine, laurylamine, ethylenediamine, trimethylenediamine, tetramethylenediamine, pentamethylenediamine, hexamethylenediamine, ethanolamine, diethanolamine, triethanolamine, allylamine and aniline salts. Among these amine salts, straight chain or branched amines of the general formulae: $C_nH_{2n+1}NH_2$, $(C_nH_{2n+1})_2NH$ and $(C_nH_{2n+1})_3N$ wherein n represents a number of 2 to 8 are preferred.

The phytic acid salt can be used in this invention so far as it is soluble in water. The salt may be a normal salt in which all of 12 hydrogen atoms have been replaced or a hydrogen salt (acid salt) in which a part of the hydrogen atoms have been replaced. Either a simple salt of phytic acid with one kind of base, or a double salt thereof with two or more kinds of bases may be used in the present invention.

The amount of phytic acid and/or its water-soluble salt in this solution is 1 to 40% (by weight; the same hereinafter), preferably 3 to 30%.

The aminobenzenesulfonic acids, which are another indispensable compoent of the treating solution used prior to the burning treatment, are o-, m- and p-aminobenzenesulfonic acids. Among these, sulfanilic acid of the general formula:

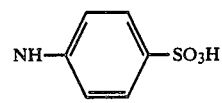

is preferred. These compounds can be used either as they are or in the form of water-soluble salts in the method of the present invention. The amount of the aminobenzenesulfonic acid and/or its water-soluble salt in this solution is preferably 0.1 to 20%, and more preferably 0.3 to 10%.

The treating solution used prior to the burning-in treatment in the present invention can contain various additives in addition to the above-mentioned indispensable components. Examples of the additives include surfactants, salts, acids and alkalis.

The surfactants are effective for assisting the uniform application of said solution to the surface of the lithographic plate and also for reducing the stain in the non-image-forming region in the burning-in treatment. Preferred surfactants are anionic surfactants. Particularly preferred anionic surfactants are sulfonic acid group-containing surfactants such as alkylbenzenesulfonates, alkyldiphenyl ether disulfonates, alkylnaphthalenesulfonates, aldehyde condensate of alkylnaphthalenesulfonates and -olefinsulfonates; and sulfuric ester surfactants such as lauryl sulfate, polyoxyethylene alkyl ether sulfates and polyoxyethylene alkylphenyl ether sulfates.

The amount of the surfactant in said solution is in the range of about 0.05 to 20%, preferably 0.1 to 10%.

The pH value of the treating solution used prior to the burning-in treatment is controlled to within the range of 2 to 10, preferably 3 to 8. By thus controlling the pH of the solution, the solution can be handled safely, the aluminum base can be protected from the etching effects of the solution and deterioration of hydrophilic properties of the aluminum oxide base surface can be prevented.

The treating solution used prior to the burning-in treatment according to the present invention may further contain gum arabic, dextrin, carboxymethylcellulose and a water-soluble high molecular substance such as polyacrylic acid, polymethacrylic acid or a salt thereof (such as sodium salt thereof), dyestuff, antifoaming agent and antiseptic.

The treating solution according to the present invention is applied to a photosensitive lithographic plate prior to the burning-in treatment but after the plate has been subjected to the imagewise exposure to light, development and, if desired, washing with water, removal of parts unnecessary to the printing with a deletiion liquid and drying to form a perfect plate having no part to be corrected. The solution is applied to the plate by means of a sponge or absorbent cotton impregnated with the solution. Other methods comprise immersing the lithographic plate in a vat containing the treating solution, or applying the solution to the plate by means of an automatic coater or by spraying. When the plate is treated with a squeegee or squeegee roll after the application, the thickness of the applied solution layer can advantageously be made uniform.

Though the amount of the treating solution to be applied to the plate is not particularly limited, it is usually 20 to 100 ml/m$^2$ and preferably 30 to 60 ml/m$^2$.

After the application of the treating solution, the lithographic plate is dried, if necessary, and then heated to a high temperature with, for example, a burning processor (such as Burning Processor 1300 of Fuji Photo Film Co., Ltd.). The heating temperature and time, which vary depending on the image-forming components, are preferably 180° to 300° C. and 1 to 20 min, respectively.

After the burning-in treatment, the lithographic plate is subjected to ordinary treatments such as washing with water and gumming-up, if necessary.

The method of the present invention can be employed for treating various photosensitive lithographic plates, particularly those having an aluminum base (i.e. presensitized lithographic plates called PS plates). Preferred examples of the PS plates include those comprising a photosensitive layer comprising a mixture of a diazo resin (a salt of a condensate of p-diazodiphenylamine and paraformaldehyde) and shellac coated aluminum plates as disclosed in British Pat. No. 1,350,521; negative working PS plates comprising a photosensitive layer comprising a mixture of a diazo resin and a polymer comprising hydroxyethyl methacrylate units or hydroxyethyl acrylate units as main recurring units provided on an aluminum plate as disclosed in British Pat. Nos. 1,460,978 and 1,505,739; positive working PS plates comprising a photosensitive layer comprising a mixture of o-quinone diazide sensitizer and a novolac phenolic resin provided on an aluminum base as disclosed in U.S. Pat. No. 4,123,279; PS plates comprising a photosensitive layer comprising a photocrosslinking photopolymer provided on an aluminum plate as illustrated in U.S. Pat. No. 3,860,426; PS plates comprising a photosensitive layer of a photopolymer composition on an aluminum plate as disclosed in U.S. Pat. Nos. 4,072,528 and 4,072,527; and PS plates comprising a photosensitive layer of a mixture of an azide and a water-soluble polymer provided on an aluminum plate as disclosed in British Pat. Nos. 1,235,281 and 1,495,861. Among these PS plates, particularly preferred in the present invention are positive PS plates having a photosensitive layer comprising an o-naphthoquinonediazide compound and a novolac resin illustrated from line 2, column 3 to line 14, column 6 of U.S. Pat. No. 4,259,434.

According to the engraving method of the present invention, the counter-etching treatment is unnecessary after the burning-in treatment. Despite the omission of said treatment, no background stain is caused in the non-image-forming portion, the ink-receptive property of the image-forming part is high and a lithographic plate having a longer press life can be obtained. Other merits of the treating solution used prior to the burning treatment are that it has only a low foaming property and, therefore, it can be applied to the lithographic plate with a spray circulation type treating machine and the process can be automated.

The present, invention is further illustrated by the following non-limitative examples.

EXAMPLE 1

2 parts by weight of 1,5-dihydroxynaphthalene/naphthoquinone-(1,2)-diamide(2)-5-sulfonic acid ester and 4 parts by weight of a novolac type cresol/formaldehyde resin were dissolved in 100 parts by weight of ethylene glycol monomethyl ether. The obtained solution was applied to a grained aluminum plate having a thickness of 0.24 mm in such an amount that its weight after drying was 2.5 g/m$^2$. The thus prepared positive working photosensitive lithographic plate was intimately contacted with a positive transparency and exposed to the light of a 3 kW metal halide lamp positioned at a distance of 1 m for 30 seconds and then developed by immersing it in 5 wt.% aqueous solution of sodium silicate for about 1 minute. After washing with water, 40 ml of a treating solution of the following composition per square meter of the plate was applied thereto and dried.

Treating solution used before burning-in treatment:

|  | Parts by weight |
| --- | --- |
| Phytic acid (50% aqueous solution) | 60 |
| Potassium hydroxide | 20 |
| Sulfanilic acid | 80 |
| Sodium isopropylnaphthalenesulfonate | 3 |
| Pure water | 837 |

The thus treated lithographic plate was heated to 260° C. in a commercially available burning processor for 6 minutes.

After cooling, the lithographic plate was gummed up with a desensitizing gum. An offset printing machine was fitted with the resulting lithographic plate and printing was effected. After printing several sheets in the initial stage, it became possible to produce beautiful prints. Thus, 150,000 beautiful prints could be obtained by continuing the printing.

COMPARATIVE EXAMPLE 1

The same procedure as in Example 1 was repeated upto the development treatment. The lithographic plate thus obtained was treated with 4 wt.% ammonium borate in place of the treating solution used in Example 1 and then the burning-in treatment and gumming-up were effected in the same manner as in Example 1. When the thus obtained lithographic plate was used for printing. Scumming was caused in the halftone shadow parts from the initial printing stage and, therefore, removal of stains in the scummed part with a plate cleaner was required.

EXAMPLE 2

The same sensitive solution as in Example 1 was applied to an aluminum plate having a thickness of 0.3 mm which had been grained and then subjected to an anodic oxidation treatment (current desity: 1.6 A/dm$^2$) in 15 wt.% sulfuric acid for 2 minutes to prepare a positive working photosensitive lithographic plate.

This plate was intimately contacted with a transparent positive and exposed to the light of a 3 kW metal halide lamp positioned at a distance of 1 m for 40 seconds and then developed by immersing it in 7 wt.% aqueous solution of sodium silicate for about 1 minute. The lithographic plate was treated continuously with an automatic interpated burning processor (a product of Process Shizai Co., Ltd. capable of effecting the application of the treating solution, burning-in and gumming-up treatments continuously). The burning-in temperatures were 150° C. in the preheating and 240° C. in the after-heating. The residence time in the furnace was about 3 minutes. The treating solution used prior to the burning had the following composition. 50 ml of this solution was applied per square meter of the plate.

Treating solution used before burning-in treatment:

| | Parts by weight |
|---|---|
| Phytic acid (50% aqueous solution) | 50 |
| Lithium hydroxide | 15 |
| Sulfanilic acid | 70 |
| Sodium diphenyl ether disulfonate (tradename: Sandet BL (a product of Sanyo Chemical Industries, Ltd.)) | 10 |
| Pure water | 855 |

After the burning-in treatment, an offset printing machine was directly fitted with the obtained lithographic plate and printing was effected. After obtaining several sheets of prints in the initial stage, it became possible to produce beautiful prints. Thus, 300,000 beautiful prints could be obtained by continuing the printing.

EXAMPLE 3

The same procedure as in Example 1 was repeated except that the aqueous solution of the following composition was used as the treating solution prior to the burning-in treatment. The results were the same as in Example 1.

Treating solution used before burning-in treatment:

| | Parts by weight |
|---|---|
| Phytic acid (50% aqueous solution) | 60 |
| Monoethanolamine | 20 |
| Sulfanilic acid | 60 |
| p-Toluenesulfonic acid | 3 |
| naphthalenesulfonic acid/formalin condensate (tradename: Demol NL, a product of Kao Atlas Co., Ltd.) | 2 |
| Sodium polyoxyethylene alkylphenol ether sulfate (tradename: Levenol WZ, a product of Kao Atlas Co., Ltd.) | 2 |
| Pure water | 853 |

EXAMPLE 4

4 parts by weight of naphthoquinone-1,2,-diazide(2)-5-sulfonic acid ester of polyhydroxyphenyl obtained by polycondensing acetone with pyrogallol as described in Example 1 of U.S. Pat. No. 3,635,709 and 4 parts by weight of novolac cresol/formaldehyde resin were dissolved in 100 parts by weight of ethylene glycol monomethyl ether. The obtained solution was applied to the same aluminum plate as in Example 2 (i.e. the plate which had been grained and subjected to the anodic oxidation treatment) in such an amount that its weight after drying was 2.5 g/m$^2$ to obtain a positive working photosensitive lithographic plate.

The thus prepared positive working photosensitive lithographic plate was subjected to imagewise exposure and development, washed with water and then a treating solution of the following composition was applied to the plate, which was then subjected to burning-in treatment at 260° C. for 5 minutes.

Treating solution used before burning-in treatment:

| | Parts by weight |
|---|---|
| Phytic acid (50% aqueous solution) | 40 |
| Sodium hydroxide | 15 |
| Potassium citrate | 10 |
| Sulfanilic acid | 70 |
| Sodium alkylsulfonate (tradename: Pinion A-32; a product of Takemoto Yushi Co., Ltd.) | 10 |
| Pure water | 855 |

The thus obtained lithographic plate was used without the gumming-up treatment. An offset printing machine was fitted with the plate and printing was effected. After obtaining several sheets of prints in the initial stage, it became possible to produce beautiful prints. Thus, 200,000 prints could be obtained by continuing the printing.

EXAMPLE 5

20 parts by weight of shellac and 3 parts by weight of a diazo resin obtained by condensing p-toluenesulfonic acid salt of p-diazodiphenylamine with formaldehyde were dissolved in 80 parts by weight of dimethylformamide. On the other hand, a grained aluminum plate was immersed in 0.2% aqueous solution of potassium zircon fluoride at 80° C. for 3 min to make it hydrophilic. After washing with water followed by drying, the solution prepared as above was applied to the plate in such an amount that its weight after drying was 2.0 g/m$^2$.

The thus prepared negative working photosensitive lithographic plate was exposed to the light of a 3 kW metal halide lamp positioned at a distance of 1 m through a negative transparency for 30 seconds and then immersed in 20 wt% aqueous solution of isopropyl alcohol for about 1 minute. When the surface of the plate was rubbed lightly with an absorbent cotton, the layer was easily removed to expose the base surface in only the non-exposed area.

After washing with water, the same treating solution as in Example 1 was applied thereto. It was dried and then subjected to the burning-in treatment effected under the same conditions as in Example 1. An offset printing machine was fitted with the plate and printing was effected. After obtaining a dozen or so sheets of prints in the initial stage, it became possible to produce clear prints. Thus, 150,000 prints having substantially a constant tone could be obtained.

EXAMPLE 6

An aluminum plate having a thickness of 0.3 mm was prepared by graining the plate with a pumice/water slurry and a nylon brush, subjecting the plate to an anodic oxidation treatment ($2A/dm^2$) in 20% sulfuric acid for 2 minutes and treating the same in 2.5 wt.% aqueous solution of sodium silicate for 1 minute.

A sensitizing solution having the following composition was applied to the aluminum plate in such an amount that its weight after drying was 2.0 $g/m^2$.

Sensitizing solution:

| | |
|---|---|
| Copolymer of 2-hydroxyethyl methacrylate/ acrylonitrile/ethyl methacrylate/ methacrylic acid (weight ratio: 37/34/22/7) | 5.0 g |
| Diazo resin prepared by condensing p-Toluenesulfonic acid salt of p-diazodiphenylamine with formaldehyde | 0.5 g |
| Victoria Pure Blue BOH (a product of Hodogaya Chemical Co., Ltd.) | 0.1 g |
| Methylcellosolve | 95 ml |
| Water | 5 ml |

The thus obtained negative working photosensitive lithographic plate was exposed to the light of a 3 kW metal halide lamp positioned at a distance of 1 m through a negative transparency for 30 seconds and then immersed in a developer having the following compostion:

Developer:

| | |
|---|---|
| Benzyl alcohol | 30 ml |
| Diethanolamine | 10 g |
| Sodium sulfite | 5 g |
| Sodium isopropylnaphthalenesulfonate | 10 g |
| Water | 1 l |

After washing the plate with water, the same treating solution as in Example 2 was applied thereto. The plate was dried and subjected to burning-in treatment under the same conditions as in Example 2. An offset printing machine was fitted with the plate and printing was effected. After obtaining several sheets of prints in the initial stage, it became possible to produce beautiful prints. Thus, 200,000 prints having substantially a constant tone could be obtained.

EXAMPLE 7

An aluminum plate was grained, subjected to the anodic oxidation treatment and treated with sodium silicate in the same manner as in Example 6. A sensitive solution having the following composition was applied to the plate in such an amount that its weight after drying was 3.0 $g/m^2$ and it was dried at 100° C. for 2 minutes.

Sensitizing solution:

| | |
|---|---|
| Methyl methacrylate/methacrylic acid (molar ratio: 85/15) (MEK solution; limiting viscosity number at 30° C.: 0.166) | 56 g |
| Trimethylolpropane triacrylate | 40 g |
| 3-Methyl-2-benzoylmethylenenaphtho (1,2-d) thiazole | 5 g |
| Phthalocyanine Blue | 3 g |
| Ethylene dichloride | 500 g |
| 2-Methoxyethyl acetate | 500 g |

After drying the plate, 3 wt.% aqueous solution of polyvinyl alcohol was applied to the surface of the photosensitive layer in such an amount that the weight thereof after drying was 1.5 $g/m^2$ and then dried.

After the exposure and development effected in the same manner as in Example 6, the plate was washed with water. The same treating solution as in Example 4 was applied to the plate and burning-in treatment was effected under the same conditions as in Example 4. An offset printing machine was fitted with the plate and printing was effected. After obtaining several sheets of prints in the initial stage, it became possible to obtain beautiful prints.

What is claimed is:

1. A method of treating a photosensitive lithographic printing plate comprising a support having coated thereon a lithographically suitable light-sensitive layer, which comprises the steps of subjecting the photosensitive lithographic printing plate to imagewise exposure to light so as to form light-struck areas and light-unstruck areas on the light-sensitive layer, developing the light-sensitive layer to remove therefrom the light-struck areas or the light-unstruck areas, and subjecting the resulting plate to burning-in treatment, in which a result effective amount of an aqueous solution containing, in admixture, (A) 1 to 40% by weight of phytic acid, its water-soluble salt, or a combination thereof and (B) 0.1 to 20% by weight of aminobenzenesulfonic acid, its water-soluble salt, or a combination thereof is applied to the lithographic plate after the development but prior to the burning-in treatment.

2. A method as set forth in claim 1, wherein the water-soluble salt of phytic acid is selected from the group consisting of alkali metal salts, ammonium salts and amine salts.

3. A method as set forth in claim 1, wherein the aminobenzenesulfonic is sulfanilic acid.

4. A method as set forth in claim 1, wherein said aqueous solution further comprises at least one surfactant.

5. A method as set forth in claim 4, wherein the amount of the surfactant in the aqueous solution is 0.05 to 20 wt.%.

6. A method as set forth in claim 1, wherein pH of the aqueous solution is between 2 to 10.

7. A method as set forth in claim 1, wherein the aqueous solution is applied to the plate in amount of 20 to 100 $ml/m^2$.

8. A method as set forth in claim 1, wherein the burning-in treatment is conducted at a temperature of 180° to 300° C. for 1 to 20 minutes.

9. A method as set forth in claim 1, wherein the photosensitive lithographic plate is that having an aluminum plate.

10. A method as set forth in claim 1, wherein the light sensitive layer comprises a diazo resin.

11. A method as set forth in claim 1, wherein the light sensitive layer comprises an o-quinone diazide sensitizer.

12. A method as set forth in claim 1, wherein the light sensitive layer comprises a photopolymerizable composition.

13. A method as set forth in claim 1, wherein the light sensitive layer comprises an o-naphthoquinone diazide compound and a novolac resin.

* * * * *